United States Patent
Yang (10) Patent No.: US 9,853,341 B2
(45) Date of Patent: Dec. 26, 2017

(54) SHELL OF ELECTRONIC DEVICE AND WAVE FILTER

(71) Applicant: FEEI CHERNG ENTERPRISE CO., LTD., New Taipei (TW)

(72) Inventor: Shu-Mei Yang, New Taipei (TW)

(73) Assignee: Feei Cherng Enterprise Co., Ltd., New Taipei (TW)

( * ) Notice: Subject to any disclaimer, the term of this patent is extended or adjusted under 35 U.S.C. 154(b) by 135 days.

(21) Appl. No.: 14/729,094

(22) Filed: Jun. 3, 2015

(65) Prior Publication Data

US 2016/0081211 A1   Mar. 17, 2016

(30) Foreign Application Priority Data

Sep. 11, 2014 (CN) .......................... 2014 1 0459829

(51) Int. Cl.
| | |
|---|---|
| *H01P 1/208* | (2006.01) |
| *H01P 7/06* | (2006.01) |
| *H05K 5/02* | (2006.01) |
| *H01L 23/04* | (2006.01) |

(52) U.S. Cl.
CPC .............. *H01P 1/208* (2013.01); *H01L 23/04* (2013.01); *H01P 7/06* (2013.01); *H01P 7/065* (2013.01); *H05K 5/0217* (2013.01); *H01L 2924/0002* (2013.01)

(58) Field of Classification Search
CPC .......... H01P 7/06; H01P 7/065; H01P 1/2088; H01P 1/208; H01L 23/04; H05K 5/0217
USPC .......................... 333/182, 227, 183, 185, 208
See application file for complete search history.

(56) References Cited

U.S. PATENT DOCUMENTS

| | | | | |
|---|---|---|---|---|
| 3,742,390 A | * | 6/1973 | Stiglitz ................. | H01P 1/2135 333/134 |
| 8,644,936 B2 | * | 2/2014 | Iyer .......................... | H01G 4/35 333/182 |

* cited by examiner

*Primary Examiner* — Rakesh Patel
(74) *Attorney, Agent, or Firm* — Alan D. Kamrath; Kamrath IP Lawfirm, P.A.

(57) ABSTRACT

A shell of an electronic device includes a base, two sidewalls, and a plurality of terminals. The base includes upper lateral and lower lateral surfaces opposite to each other. The two sidewalls are disposed at the upper lateral surface and are located separately at two opposite sides of the base. The two sidewalls are opposite to each other, with each sidewall having a surface that faces away from the base. The plurality of terminals is symmetrically arranged in order at the other opposite sides of the base and is embedded in the base. Each terminal includes an upper section and a lower section, with the upper section vertically extending upwards from the upper lateral surface, with the lower section horizontally extending outwards from the lower lateral surface, and with at least a portion of the lower section affixed flatly to the lower lateral surface.

12 Claims, 11 Drawing Sheets

SHELL OF ELECTRONIC DEVICE AND WAVE FILTER

BACKGROUND OF THE INVENTION

1. Field of the Invention

The present invention relates to a shell and, more particularly, relates to a shell of an electronic device and its wave filter.

2. Description of the Prior Art

The existing wave filter comprises a shell, a plurality of coils, and a plurality of terminals. The shell includes a base and a cover. The base forms a containing space. The terminals insert at the sidewall of the base. An upper section of the terminal pierces from the surface of the sidewall. A lower section of the terminal pierces from the base of the shell. The coils are disposed in the containing space. A lead extending from the coil connects to the upper section of the terminal. The cover covers the base to seal the containing space. In the prior art, the lower sections of the terminals are easier to slant such as by collision due to lack of support. When the wave filter is welded to the circuit board, the yield may be affected due to the slanting of the lower sections of the terminals. The connecting of the cover and the base is generally by sticking. However, it is likely to cause adhesive residue which affects the appearance and increases the complexity of the process. Furthermore, when the wave filter and the circuit board are in the reflow soldering process, air in the enclosed containing spaces expands with heat which may result in breaking the cover. In addition, the contour of the containing space of the existing shell is upright and straight, which cannot be complementary to the contour of the loop coil. Therefore, it is more difficult to position the loop coil into the containing space, and it is likely to cause deformation of the shell when in high temperature.

SUMMARY OF THE INVENTION

In view of this, the object of the present invention is to provide a shell of an electronic device and a wave filter to make the lower sections of the terminals not easy to skew, the cover and the sidewalls more convenient to be connected, the cover will not be broken due to the expanding of air enclosed inside when in the reflow soldering process, the loop coils easier to be positioned, and the shell not easy to be deformed when in high temperature.

To achieve the above object, the present invention provides a shell of an electronic device which comprises a base, two sidewalls, and a plurality of terminals. The base comprises four surfaces, an upper lateral surface and a lower lateral surface. The upper lateral surface and the lower lateral surface are opposite to each other. The two sidewalls are disposed at the upper lateral surface and located respectively at two opposite sides of the four sides of the base. The two sidewalls are opposite to each other. Each sidewall has a surface that faces away from the base. The terminals are arranged in order at another two opposite sides of the four sides of the base and are embedded in the base. Each terminal includes an upper section and a lower section, the upper section vertically extends upwards from the upper lateral surface, the lower section horizontally extends outwards from the lower lateral surface, and at least a portion of the lower section is affixed flatly to the lower lateral surface.

In one embodiment, each terminal further comprises a middle section, the middle section is embedded in the base, the middle section and the lower section form an L shape, and the middle section and the upper section form an I shape.

In one embodiment, the shell further comprises a cover, and the cover connects to the surfaces of the two sidewalls. A hollow cavity is formed between the cover and the upper lateral surface, and the upper section of each terminal is located in the hollow cavity.

In one embodiment, each sidewall further includes an engaging portion disposed at the surface. The engaging portion comprises an engaging groove. The cover comprises two engaging plates located respectively at two sides of the cover and extending horizontally, and the two engaging plates engage in the engaging grooves of the two sidewalls.

In one embodiment, the two engaging grooves of the two sidewalls have different widths, and the two engaging plates are complementary to the two engaging grooves of the two sidewalls having the different widths.

In one embodiment, the cover includes a positioning pillar extending vertically, the base includes a positioning hole, and the positioning pillar is inserted in the positioning hole.

In one embodiment, the base includes a container, recessing at the upper lateral surface, and the container includes a container wall forming a plurality of curved contours which connect with each other.

In one embodiment, there are two containers symmetrically disposed.

In one embodiment, each curved contour comprises a concave contour and a convex contour, the concave contour extends toward the outside of the container, the convex contour extends toward the inside of the container, and the concave contour and the convex contour connect smoothly to each other.

To achieve the above object, the present invention also provides a wave filter which comprises the shell of the electronic device and a plurality of loop coils. The loop coils are disposed in the container, and outer peripherals of the loop coils correspond to the curved contours. Each loop coil includes an extending lead, and the extending leads of the loop coils respectively connect to the upper sections of the terminals.

The shell of the electronic device and the wave filter provided by the present invention can make the lower sections of the terminals not easy to skew, the cover and the sidewalls more convenient to be connected, the cover will not be broken due to the expanding of air enclosed inside when in the reflow soldering process, the loop coils easier to be positioned, and the shell not easy to be deformed when in high temperature.

To make the purpose, the features, and the advantages of this present invention easier to be comprehended by those who have general knowledge in the field, the following text provides preferred embodiments with the accompanying drawings described in detail below.

DESCRIPTION OF THE PREFERRED EMBODIMENTS

To make the purpose, the features and the advantages of the present invention easier to understand to those who have general knowledge in the field, the preferred embodiments with the accompanying drawings are described in detail below.

Reference will now be made in detail to the preferred embodiments of the present invention, examples of which are illustrated in the accompanying drawings. Wherever possible, the same reference numbers are used in the drawings and the description to refer to the same or like parts.

Figure 1:
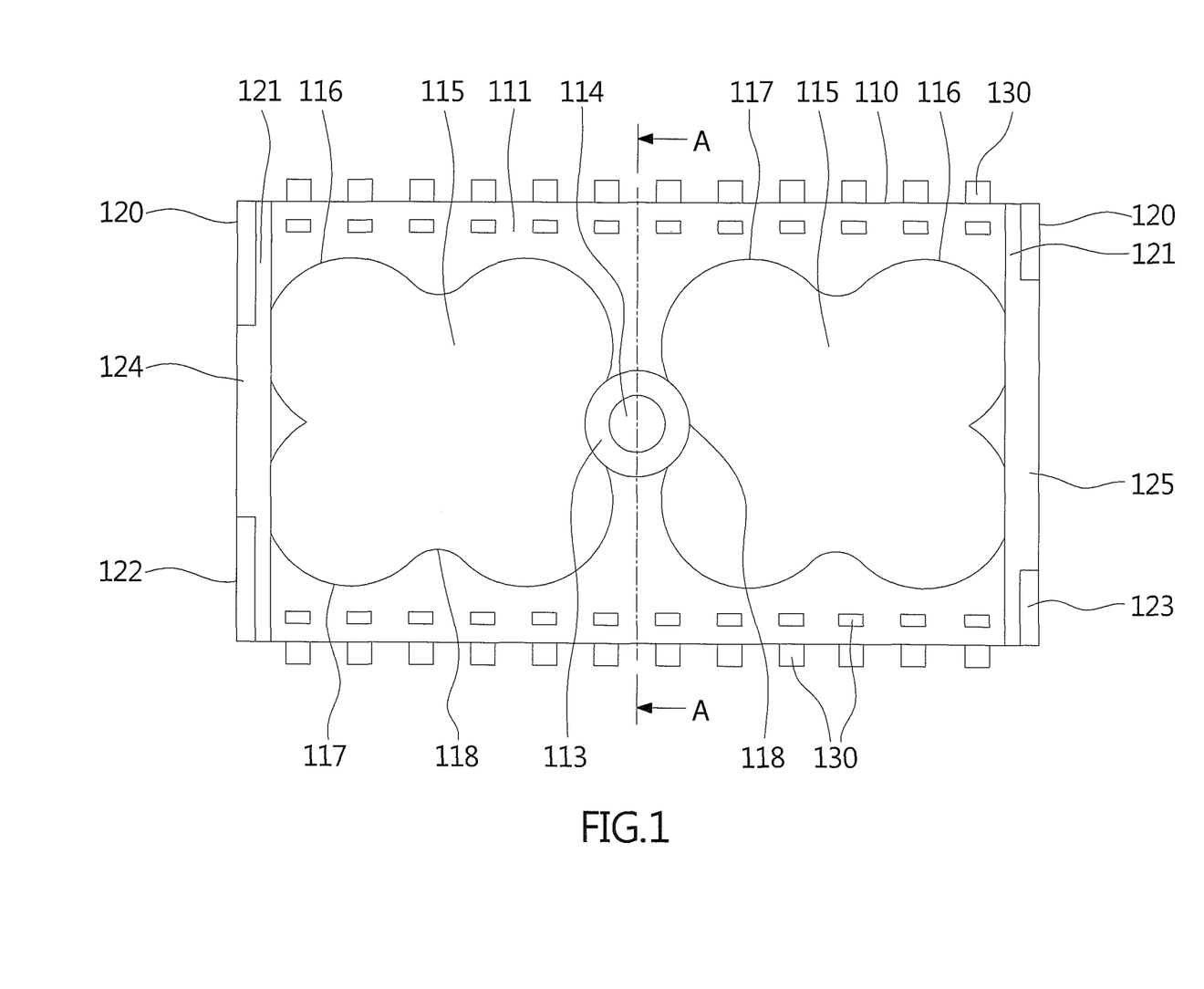
FIG. 1 is the top view of one preferred embodiment of the base, sidewalls, and the terminals.
Figure 2:
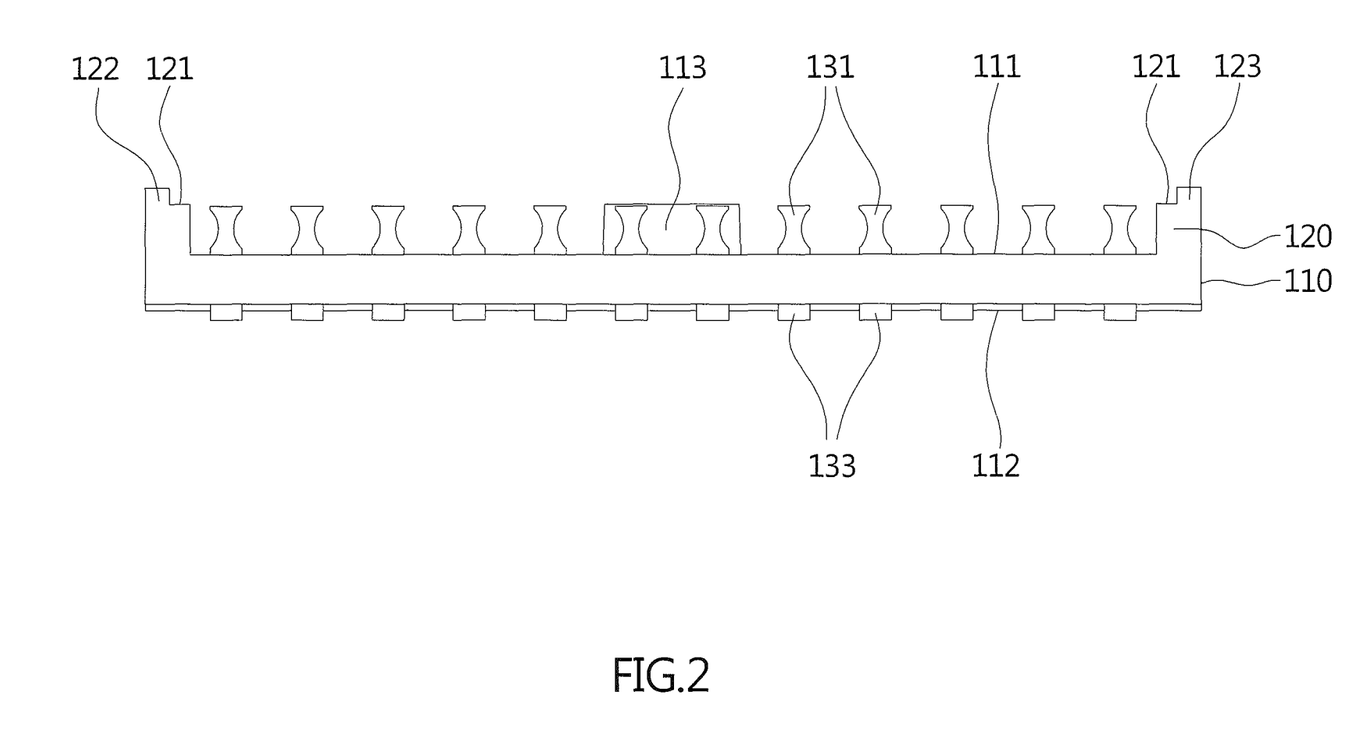
FIG. 2 is the front view of one preferred embodiment of the base, sidewalls, and the terminals.
Figure 3:
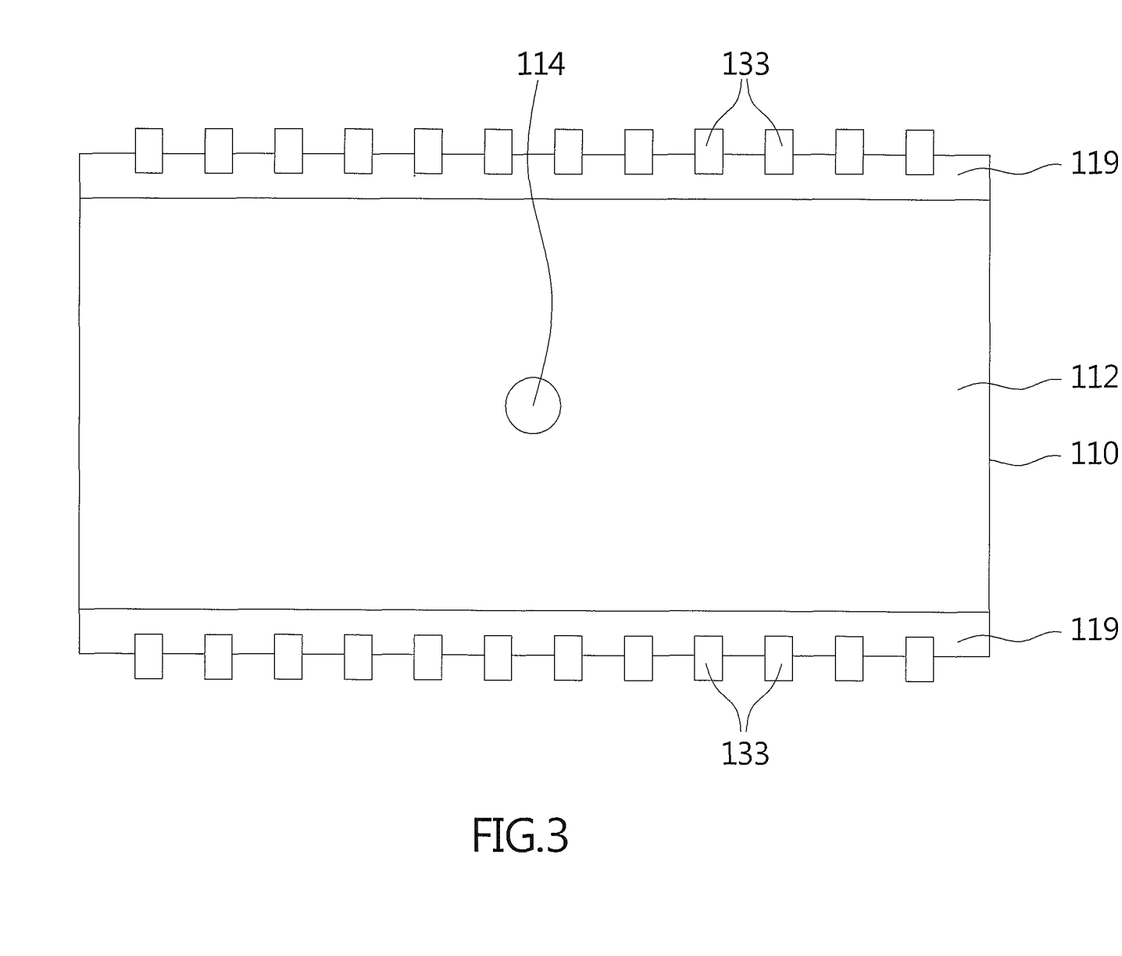
FIG. 3 is the bottom view of one preferred embodiment of the base, sidewalls, and the terminals.
Figure 4:
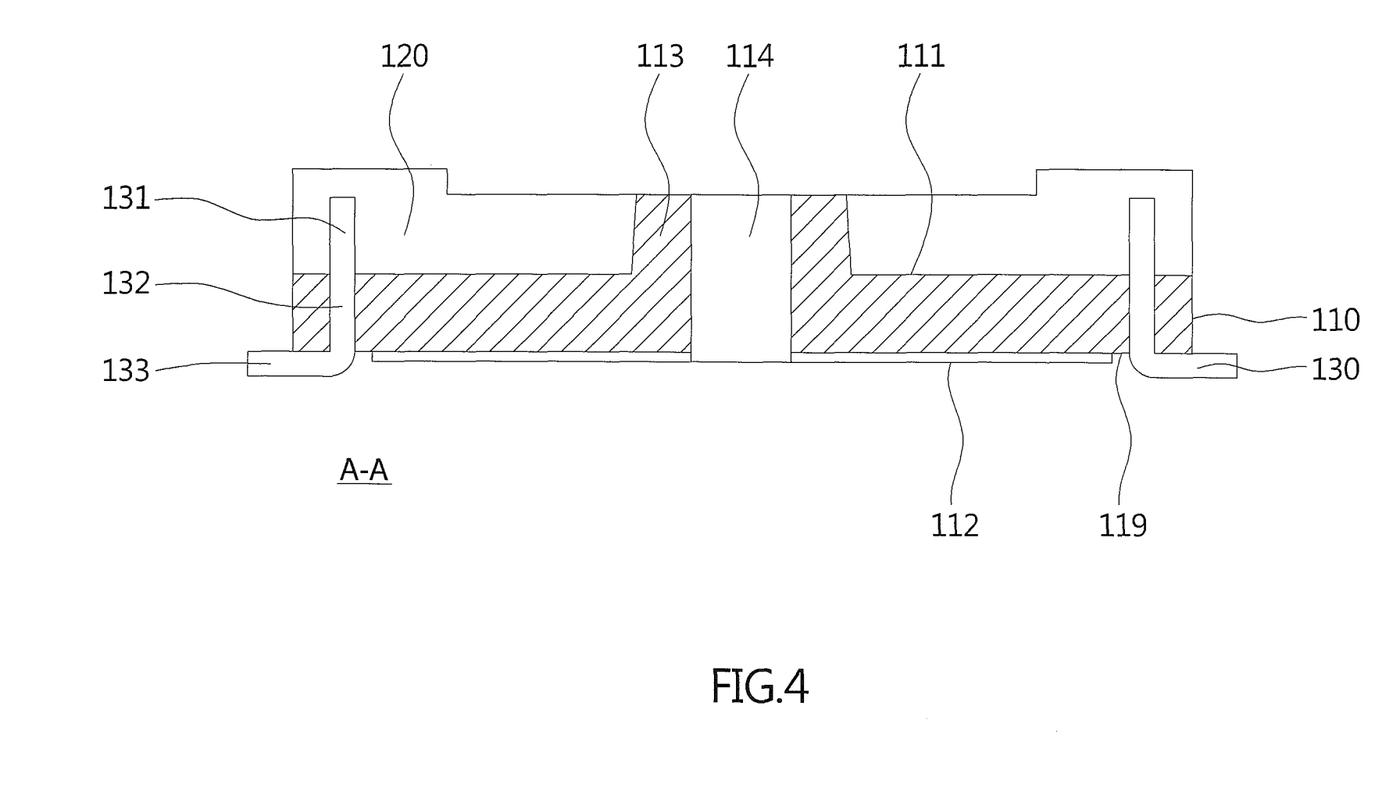
FIG. 4 is the sectional view of one preferred embodiment of the base, sidewalls, and the terminals according to section line A-A of FIG. 1.
Figure 5:
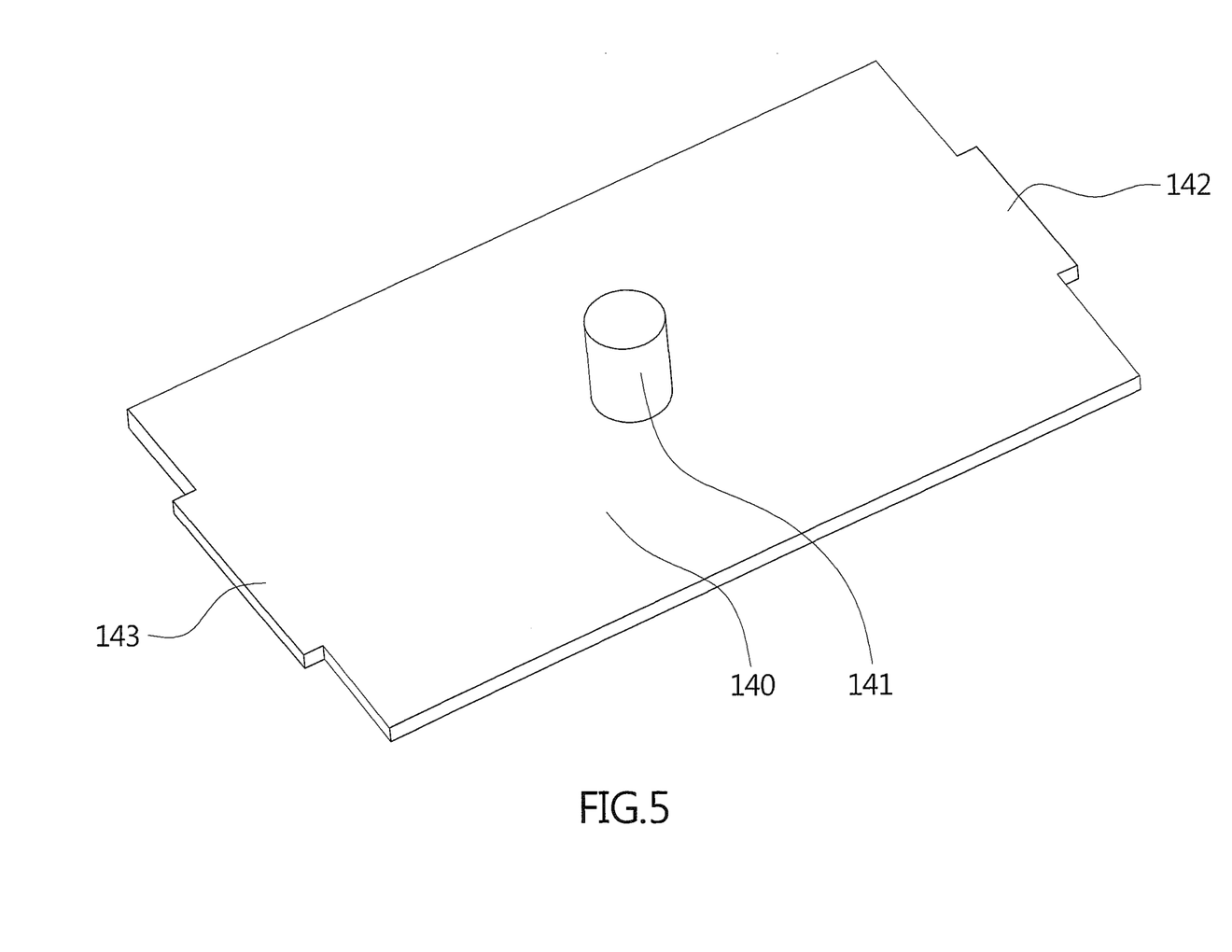
FIG. 5 is the sketch diagram of one preferred embodiment of the cover.

Please simultaneously refer to FIG. 1 through FIG. 5. FIGS. 1 to 3 are the top, front, and bottom views of one preferred embodiment of the base, sidewalls, and the terminals. FIG. 4 is the sectional view of one preferred embodiment of the base, sidewalls, and the terminals along the A-A line of FIG. 1. FIG. 5 is the sketch diagram of one preferred embodiment of the cover. A shell 100 of an electronic device of the embodiment comprises a base 110, two sidewalls 120, and a plurality of terminals 130. The base 110 comprises an upper lateral surface 111 and a lower lateral surface 112, and the upper lateral surface 111 and the lower lateral surface 112 are opposite to each other. The two sidewalls 120 are disposed at the upper lateral surface 111 and are located respectively at the opposite sides of the base 110. The two sidewalls 120 are opposite to each other, with each sidewall 120 having a surface 121 that faces away from the base 110. The terminals 130 are symmetrically arranged in order at the other opposite sides of the base 110 (i.e. the sides without the two sidewalls 120 of the base 110), and the terminals 130 are embedded in the base 110. The cover 140 is used to connect the two sidewalls 120 and contact the surfaces 121, and a hollow cavity 101 is formed between the cover 140 and the upper lateral surface 111 (refer to FIG. 6).

The base 110 further includes a pillar 113, a positioning hole 114, and a container 115. The pillar 113 is located in the center of the base 110, and the pillar 113 extends vertically from the upper lateral surface 111. The positioning hole 114 stands on the pillar 113 and penetrate vertically from the top of the pillar 113 to the lower lateral surface 112. The container 115 recesses at the upper lateral surface 111. The container 115 includes a container wall 116, and the container wall 116 forms a plurality of curved contours which connect with each other. In this embodiment, there are two containers symmetrically disposed. The two containers 115 are located at two opposite sides of the pillar 113 and the positioning hole 114. Each curved contour comprises a concave contour 117 and a convex contour 118. The concave contour 117 extends toward the outside of the container 115, and the convex contour 118 extends toward the inside of the container 115. The concave contour 117 and the convex contour 118 smoothly connect to each other. In this embodiment, each container 115 looks like four overlapped columns arranged in a 2×2 matrix. The container 115 is used to place a plurality of loop coils (not shown in the figures) of a waver filter. Since the outer peripherals of the loop coils are circular, the outer peripherals of the loop coils correspond to the curved contours of the container 115. Such a structure not only widely increases the convenience of positioning the loop coils into the containers 115, but also increases the mechanical strength of the base 110, with the geometric shape and thickness of the curved contour of the container wall 116 of the container 115 makes the shell 100 not easy to be deformed in high temperature.

The two sidewalls 120 further include engaging portions 122, 123 respectively. The two engaging portions 122, 123 are respectively disposed at the two surfaces 121. Each engaging portion 122 comprises an engaging groove 124, and the engaging portion 123 comprises an engaging groove 125. The engaging grooves 124, 125 extend respectively from an engaging wall (without number) of the surfaces 121 to recess to form their shape. As shown in FIG. 5, the cover 140 comprises a positioning pillar 141 and two engaging plates 142, 143. The engaging plates 142, 143 are located respectively at two sides of the cover 140 and horizontally extends. The engaging plates 142, 143 engage with the engaging grooves 124, 125. By such an engaging method, the cover 140 conveniently connects to the sidewalls 120. Without the use of glue, there is no problem of remaining glue, and the process can be further simplified. The two engaging grooves 124, 125 have different widths, and the two engaging plates 142, 143 are complementary to the two engaging grooves 124, 125 having the different widths. Therefore, when engaging the cover 140 with the sidewalls 120, the assembly worker can position the orientation point according to the above different width design. Besides, the positioning pillar 141 is located at the centre of the cover 140 and extends vertically, and the positioning pillar 141 corresponds to the positioning hole 114. When the cover 140 engages with the positioning hole 114, the positioning pillar 141 will simultaneously insert into the positioning hole 114 to ensure that the cover 140 does not shift.

As shown in FIG. 4, each terminal 130 includes an upper section 131, a middle section 132, and a lower section 133. The upper section 131 vertically extends upwards from the upper lateral surface 111, the middle section 132 is embedded in the base 110, and the lower section 133 horizontally extends outwards from the lower lateral surface 112. A portion of the lower section 133 is affixed flatly to the lower lateral surface 112, and another portion of the lower section 133 exits the lower lateral surface 112 and extends to the outside of the base 110. The middle section 132 and the lower section 133 form an L shape, and the middle section 132 and the upper section 131 form an I shape.

Since the lower section 133 of the terminal 130 directly extends horizontally outward from the lower lateral surface 112 of the base 110, and at least a portion of the lower section 133 is affixed flatly to the lower lateral surface 112 and supported by the lower lateral surface 112, the lower section 133 of the terminal 130 is not easy to slant due to an external force such as collision, and there is no need to reform the uniformity of the lower section 133. In this embodiment, the upper section 131 is located in the hollow cavity 101 (see FIG. 6), and the upper section 131 abuts the top of the cover 140. In the present embodiment, both sides of the lower lateral surface 112 respectively include a gap 119, and the lower section 133 is located in the gap 119.

Figure 6:
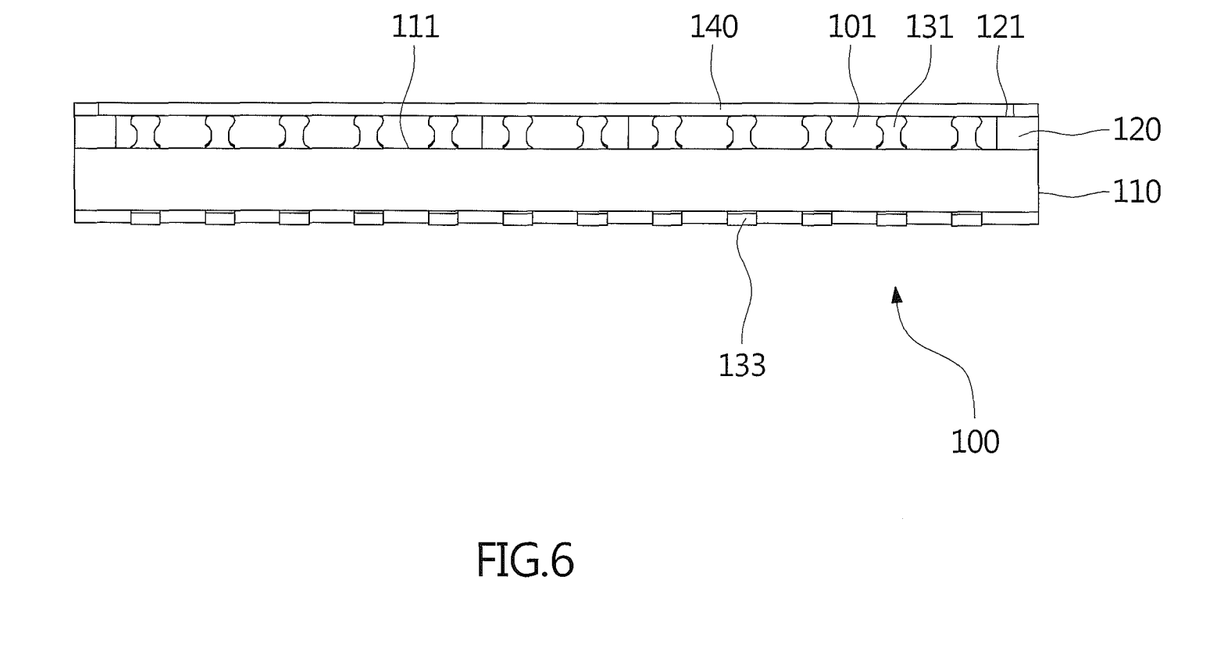
FIG. 6 is the front view of one preferred embodiment of the shell.
Figure 7:
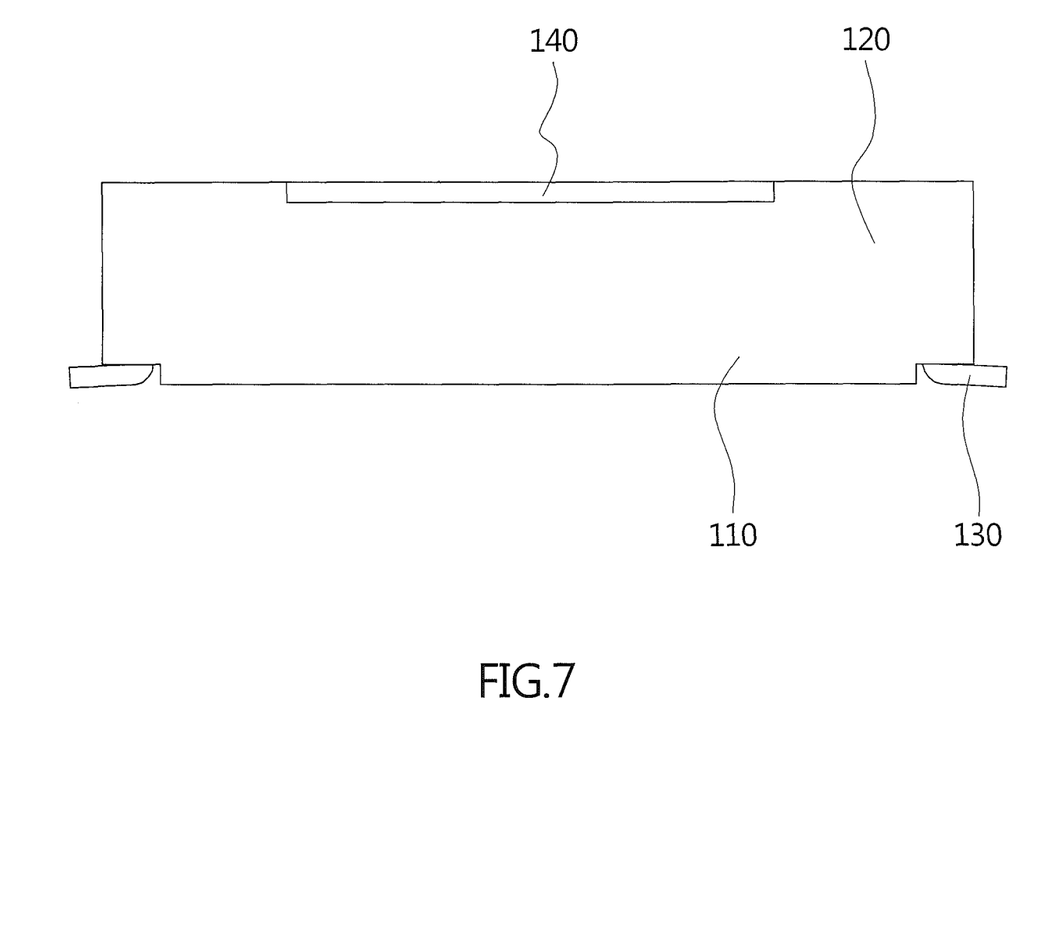
FIG. 7 is the side view of one preferred embodiment of the shell.

Please refer to FIGS. 6 and 7. FIGS. 6 and 7 are the front and side views of the shell 100. In the present embodiment, when the shell 100 is installed with a plurality of loop coils (not shown) and the cover 140 is assembled to the sidewall 120, the whole body is a wave filter. The wave filter comprises, as shown in FIG. 1 to FIG. 5, the base 110, the sidewalls 120, the terminals 130, and the cover 140, and the loop coils. During assembly of the wave filter, the loop coils are disposed in the container 115 of the shell 100 at first, and there are leads extending from the loop coils and connecting with the upper section 131. Then the cover 140 is engaged with the engaging portions 122, 123 of the two sidewalls 120 to form the sample as shown in FIG. 6 and FIG. 7. With the design of the hollow cavity 101, when the wave filter is placed on the IC board to perform the reflow soldering, heated and expanding air inside the shell 100 can be released from the hollow cavity 101. Therefore, there is no problem of damage of the cover 140 caused by the expanding and un-released air.

Figure 8:
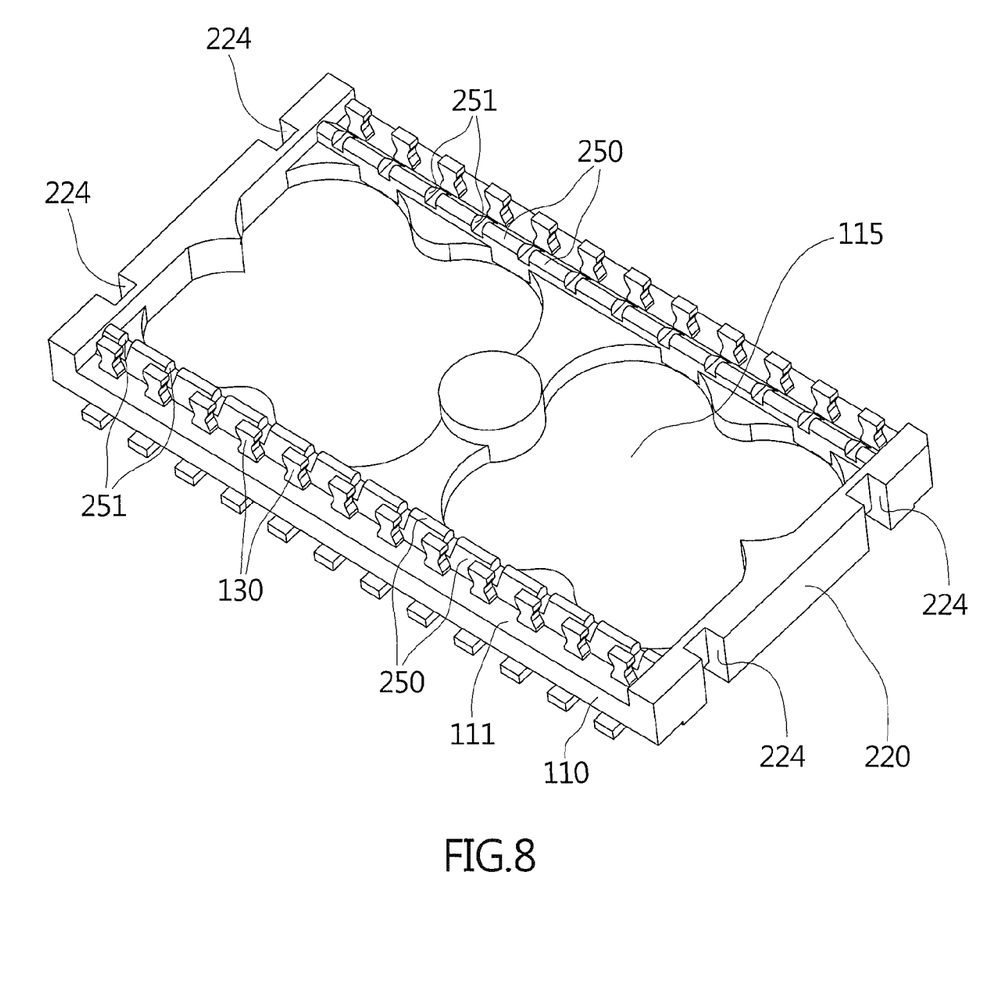
FIG. 8 is the sketch diagram of the second preferred embodiment of the base, sidewalls, and terminals.
Figure 9:
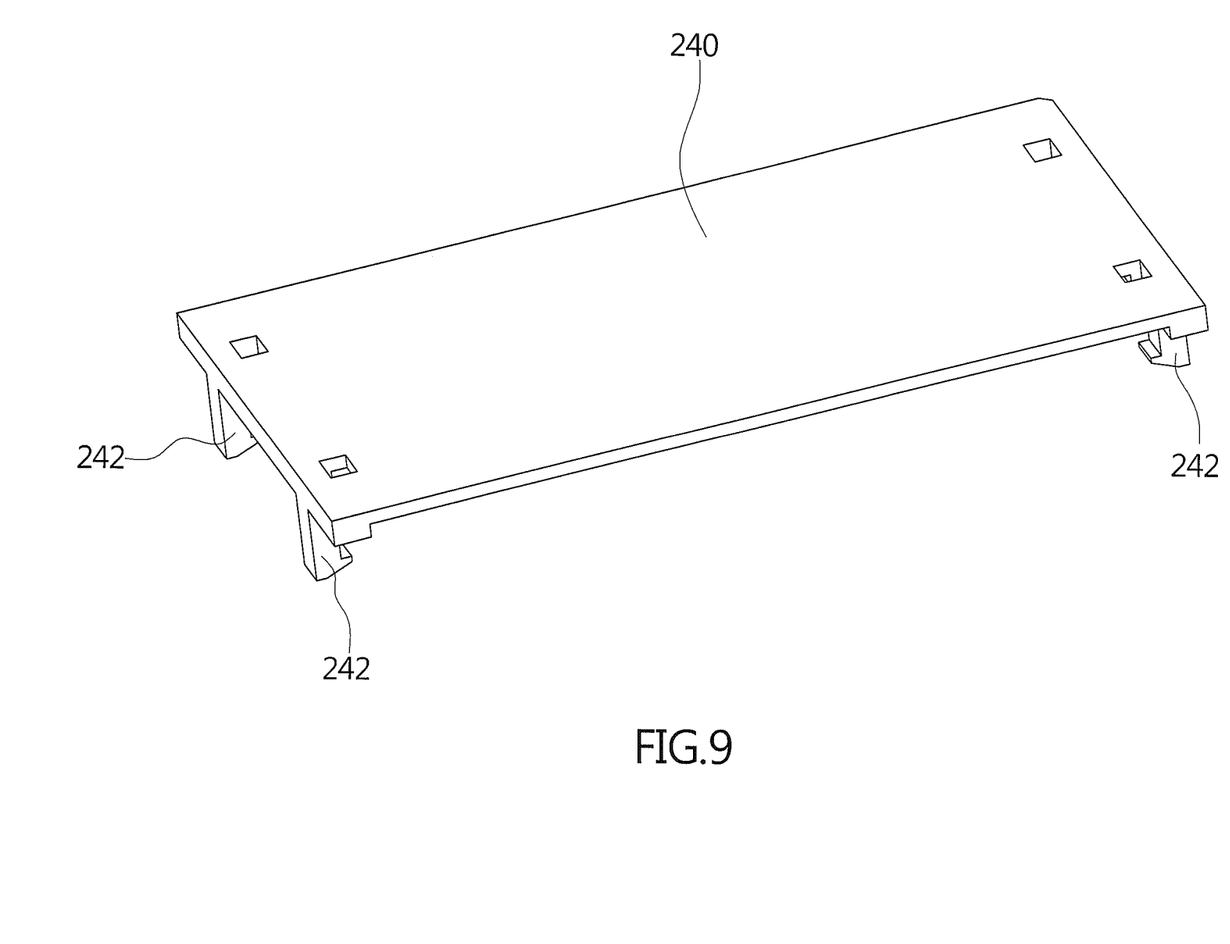
FIG. 9 is the sketch diagram of the second preferred embodiment of the cover.
Figure 10:
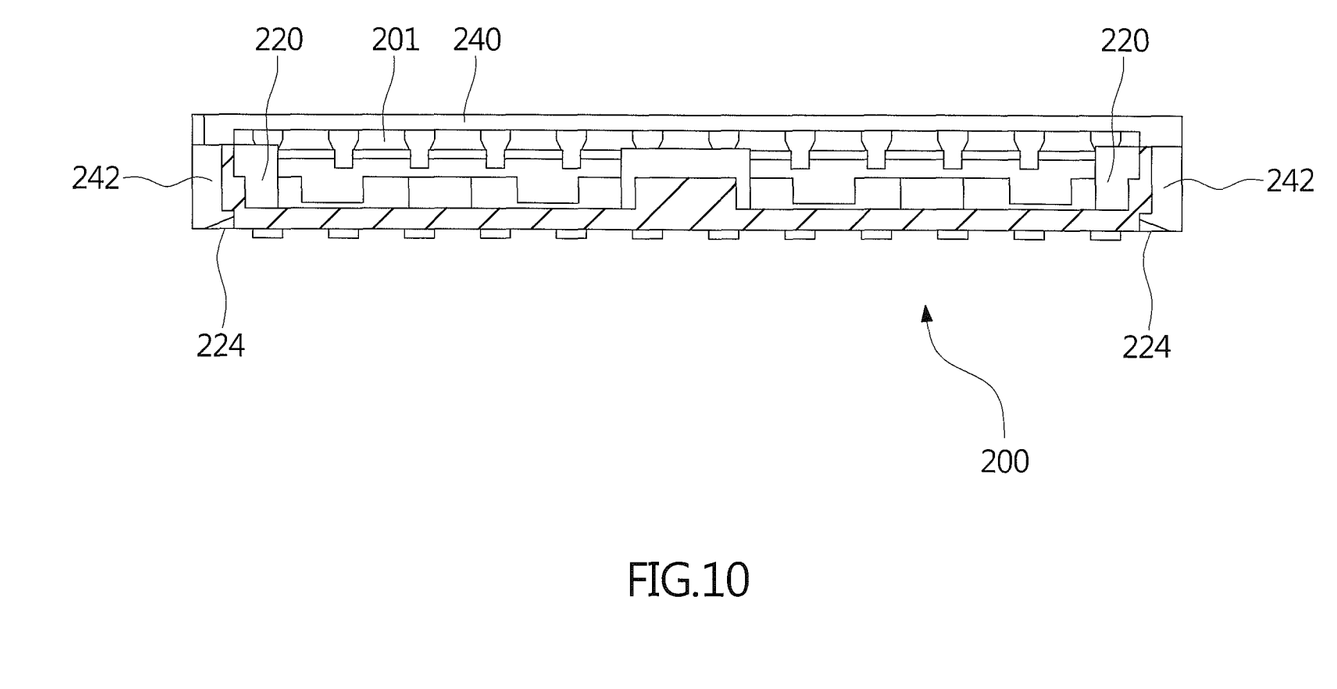
FIG. 10 is the front view of the second preferred embodiment of the shell.

Please refer to FIGS. 8 to 10. FIG. 8 is the sketch diagram of the second preferred embodiment of the base, sidewalls, and terminals. FIG. 9 is the sketch diagram of the second preferred embodiment of the cover. FIG. 10 is the front view of the second preferred embodiment of the shell. The difference between the shell 200 having the hollow cavity 201 in FIGS. 8-10 and the shell 100 is only in some elements. The remaining equivalent elements use the same reference numbers, while some of the equivalent elements will not be redundantly described anymore. The upper lateral surface 111 of the base 110 of the shell 200 is further disposed with a retaining wall 250, and the retaining wall 250 is in two rows and respectively positioned between the container 115 and the terminals 130. The retaining wall 250 recesses to be disposed with a plurality of guide containers 251, and the guide containers 251 correspond to the positions of the terminals 130. During the manufacturing of the wave filter, the leads extending from the loop coils (not shown in figures) disposed in the container 115 can connect to the terminals 130 along the guide containers 251, and the guide containers 251 can help the leads and can prevent the leads from being contacting with the neighbor leads. As shown in FIG. 8, the outside of the sidewalls 200 of the shell 220 recesses to be disposed with engaging grooves 224. As shown in FIG. 9, there are engaging plates 242 extending downward from two sides of the cover 240. As shown in FIG. 10, the geometric shapes of the engaging plates 242 are approximately complementary to those of the engaging grooves 224.

Figure 11:
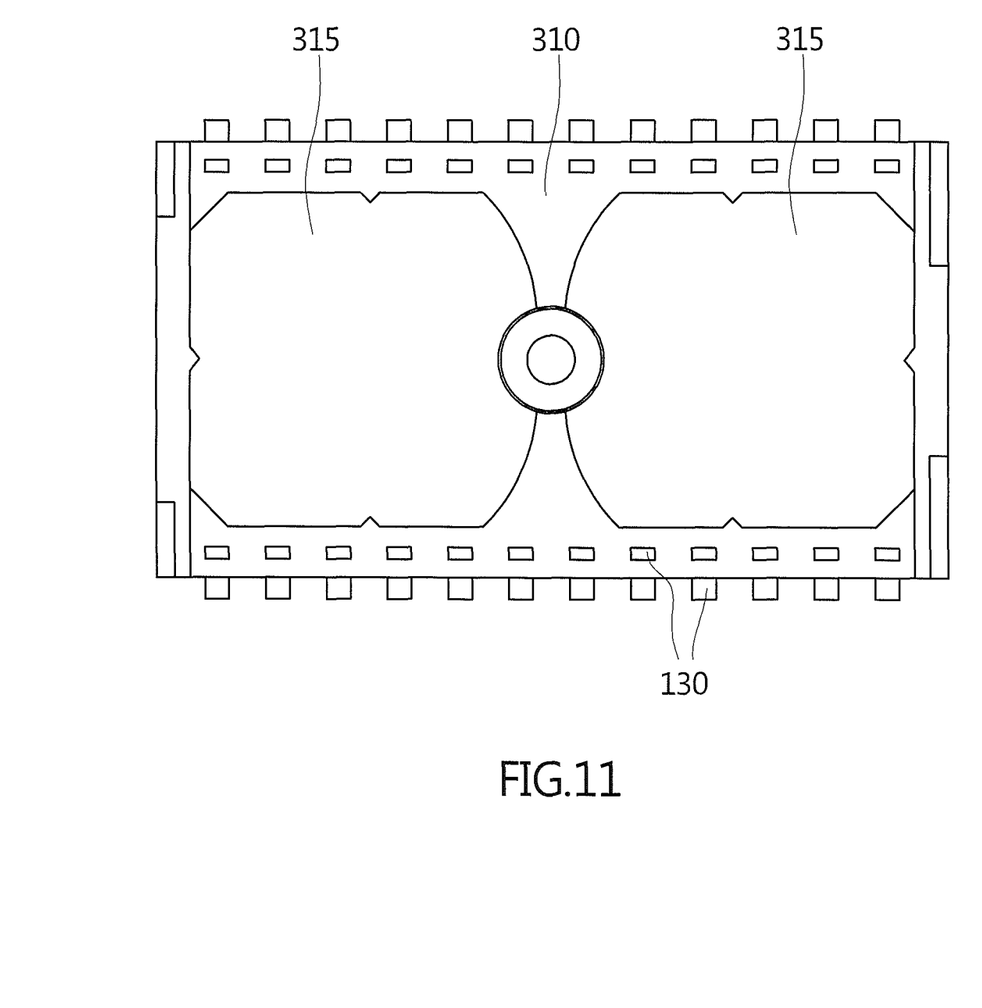
FIG. 11 is the top view of the third preferred embodiment of the base, sidewalls, and terminals.

Please refer to FIG. 11. FIG. 11 is the top view of the third preferred embodiment of the base, sidewalls, and terminals. The difference between the base 310 in FIG. 11 and the base 110 is in the container 315 and the container 115. In this embodiment, the contour of the container wall of the container 315 of the base 310 is close to a polygon. Compared to the prior art, the polygonal contour of the container 315 can also correspond to the periphery contour of the loop coils to lay the loop coils in the container 315.

To sum up, the shell of the electronic device and the wave filter provided by the present invention can make the lower sections of the terminals not easy to skew, the cover and the sidewalls more convenient to be connected, the cover will not be broken due to the expanding of air enclosed inside when in the reflow soldering process, the loop coils easier to be positioned, and the shell not easy to be deformed when in high temperature.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

I claim:

1. A shell of an electronic device, comprising:
    a base comprising four sides, an upper lateral surface and a lower lateral surface, with the upper lateral surface and the lower lateral surface opposite to each other;
    two sidewalls disposed at the upper lateral surface and located respectively at two opposite sides of the four sides of the base, with the two sidewalls opposite to each other, with each sidewall having a surface that faces away from the base; and
    a plurality of terminals arranged in order at another two opposite sides of the four sides of the base and embedded in the base, with each terminal including an upper section and a lower section, with the upper section vertically extending upwards from the upper lateral surface, with the lower section horizontally extending outwards from the lower lateral surface, and with at least a portion of the lower section affixed flatly to the lower lateral surface.

2. The shell of the electronic device as claim 1, wherein each terminal further comprises a middle section, wherein the middle section is embedded in the base, wherein the middle section and the corresponding lower section form an L shape, and wherein the middle section and the corresponding upper section form an I shape.

3. The shell of the electronic device as claim 1, further comprising a cover, wherein the cover connects to the surfaces of the two sidewalls, wherein a hollow cavity is formed between the cover and the upper lateral surface, and wherein the upper section of each terminal is located in the hollow cavity.

4. The shell of the electronic device as claim 3, wherein each sidewall further includes an engaging portion, wherein the engaging portion is disposed at the respective surface of the corresponding sidewall, wherein the engaging portion comprises an engaging groove, wherein the cover comprises two engaging plates, and wherein the two engaging plates engage in the engaging grooves of the two sidewalls.

5. The shell of the electronic device as claim 4, wherein the engaging grooves of the two sidewalls have different widths, and wherein the two engaging plates are complementary to the engaging grooves of the two sidewalls having the different widths.

6. The shell of the electronic device as claim 3, wherein the cover includes a positioning pillar, wherein the positioning pillar extends vertically, wherein the base includes a positioning hole, and wherein the positioning pillar is inserted in the positioning hole.

7. The shell of the electronic device as claim 1, wherein the base includes a container, wherein the container recesses at the upper lateral surface, wherein the container includes a container wall, and wherein the container wall forms a plurality of curved contours which connect with each other.

8. The shell of the electronic device as claim 7, wherein the container comprises two containers.

9. A wave filter comprising:
    the shell of the electronic device of claim 8; and
    a plurality of loop coils disposed in the two containers, with outer peripherals of the plurality of loop coils corresponding to the plurality of curved contours, wherein each loop coil includes an extending lead, and wherein the extending leads of the plurality of loop coils respectively connect to the upper sections of the plurality of terminals.

10. The shell of the electronic device as claim 7, wherein each curved contour comprises a concave contour and a convex contour, wherein the concave contour extends towards an outside of the container, wherein the convex contour extends towards an inside of the container, and wherein the concave contour and the convex contour smoothly connect to each other.

11. A wave filter comprising:
the shell of the electronic device of claim 10; and
a plurality of loop coils disposed in the container, with outer peripherals of the plurality of loop coils corresponding to the plurality of curved contours, wherein each loop coil includes an extending lead, and wherein the extending leads of the plurality of loop coils respectively connect to the upper sections of the plurality of terminals.

12. A wave filter comprising:
the shell of the electronic device of claim 7; and
a plurality of loop coils disposed in the container, with outer peripherals of the plurality of loop coils corresponding to the plurality of curved contours, wherein each loop coil includes an extending lead, and wherein the extending leads of the plurality of loop coils respectively connect to the upper sections of the plurality of terminals.

* * * * *